(12) United States Patent
Weinstein et al.

(10) Patent No.: US 12,228,607 B2
(45) Date of Patent: Feb. 18, 2025

(54) TEMPERATURE COMPENSATION OF OPTICALLY ISOLATED PROBE

(71) Applicant: Teledyne LeCroy, Inc., Thousand Oaks, CA (US)

(72) Inventors: Matthew Weinstein, Glen Rock, NJ (US); Francois Lamarche, New Milford, NJ (US); Lawrence Jacobs, Rockville, MD (US)

(73) Assignee: TELEDYNE LECROY, INC., Thousand Oaks, CA (US)

( * ) Notice: Subject to any disclaimer, the term of this patent is extended or adjusted under 35 U.S.C. 154(b) by 129 days.

(21) Appl. No.: 18/298,249

(22) Filed: Apr. 10, 2023

(65) Prior Publication Data

US 2024/0337685 A1   Oct. 10, 2024

(51) Int. Cl.
*G01R 31/28* (2006.01)
*G01R 31/302* (2006.01)

(52) U.S. Cl.
CPC ..... *G01R 31/2874* (2013.01); *G01R 31/3025* (2013.01)

(58) Field of Classification Search
CPC ........................ G01R 31/2874; G01R 31/3025
USPC .................................................. 324/750.03
See application file for complete search history.

(56) References Cited

U.S. PATENT DOCUMENTS

| | | | |
|---|---|---|---|
| 9,209,593 B2 | 12/2015 | Mende et al. | |
| 9,331,776 B2 | 5/2016 | Mende et al. | |
| 9,557,399 B2 | 1/2017 | Mende et al. | |
| 10,225,022 B2 | 3/2019 | Booman et al. | |
| 2008/0130800 A1* | 6/2008 | Maxim | H03C 3/40 375/345 |
| 2010/0105342 A1* | 4/2010 | Pei | H03F 3/46 330/149 |
| 2018/0054337 A1* | 2/2018 | Khoury | H04L 27/06 |
| 2019/0204356 A1 | 7/2019 | Mende et al. | |

* cited by examiner

*Primary Examiner* — Raul J Rios Russo
(74) *Attorney, Agent, or Firm* — K&L Gates LLP

(57) ABSTRACT

A receiver comprising a magnitude correction circuit to receive an electrical signal defined by a phase. The electrical signal is a combined electrical signal comprising a first signal and a second signal. The magnitude correction circuit comprising a detector to generate a control signal proportional to received power of the second signal and an error amplifier coupled to the detector to compare a reference voltage against an output of the detector to determine an amplification or attenuation of the second signal based on a drift of the electrical signal. The receiver further comprising a variable gain amplifier coupled to the magnitude correction circuit to generate a compensated electrical signal based on the amplification or attenuation of the second signal determined by the magnitude correction circuit and a de-modulating mixer coupled to the magnitude correction circuit, the de-modulating mixer to mix a phase compensated signal and the compensated electrical signal.

20 Claims, 6 Drawing Sheets

TEMPERATURE COMPENSATION OF OPTICALLY ISOLATED PROBE

FIELD

This disclosure relates generally to the field of testing electrical systems. More particularly the present disclosure is generally directed to electro-optical probe measurement systems for use in conjunction with an oscilloscope.

BACKGROUND

An optically isolated probing measurement system employs modulation of an electrical signal from a device under test (DUT) to a frequency that can be converted into an optical signal, transmitted over an optical fiber, converted back to an electrical signal, and then demodulated back to the original frequency to be terminated into and measured by the oscilloscope. The process of these conversions when realized in hardware has significant thermal related drifts. Temperature correction and compensation should provide accurate measurement with good signal fidelity within normal temperature drift expected in electrical lab settings.

SUMMARY

In part, in one aspect, the disclosure relates to a receiver comprising a magnitude correction circuit to receive an electrical signal defined by a phase. The electrical signal is a combined electrical signal comprising a first signal and a second signal. The magnitude correction circuit comprises a detector to generate a control signal proportional to received power of the second signal and an error amplifier coupled to the detector to compare a reference voltage against an output of the detector to generate a signal proportional to the difference between the reference voltage and the output of the detector to determine an amplification or attenuation of the second signal based on a drift of the electrical signal. The receiver comprising a variable gain amplifier coupled to the magnitude correction circuit. The variable gain amplifier to generate a compensated electrical signal based on the amplification or attenuation of the second signal determined by the magnitude correction circuit. The receiver comprising a de-modulating mixer coupled to the magnitude correction circuit. The de-modulating mixer is to mix a phase compensated signal and the compensated electrical signal.

In another aspect, the disclosure relates to a receiver comprising a phase correction circuit to receive an electrical signal defined by a phase. The electrical signal is a combined electrical signal comprising a first signal and a second signal. The phase correction circuit comprising a modulator circuit to receive a reference signal defined by the phase of the electrical signal and a temperature dependent phase compensated signal. The modulator circuit is to output a phase compensated modulated signal. The receiver comprises a de-modulating mixer coupled to the phase correction circuit. The de-modulating mixer is to mix the phase compensated modulated signal from the phase correction circuit and a compensated first signal.

In another aspect, the disclosure relates to a system comprising a transmitter. The transmitter comprises a reference clock with a reference clock signal, a mixer coupled to the reference clock to mix the reference clock signal with an input to the transmitter to output a first signal, a summation circuit coupled to the reference clock and the mixer to combine the first signal and the reference clock signal to form a combined electrical signal, and an electrical to optical converter to convert the combined electrical signal into an optical signal. The system comprising a receiver. The receiver comprising a temperature sensor, an optical to electrical converter to receive an optical signal and convert the optical signal to an electrical signal defined by a phase. The electrical signal is a combined electrical signal comprising the first signal and a second signal. The receiver comprising a magnitude correction circuit coupled to the optical to electrical converter. The magnitude correction circuit is to determine an amplification or attenuation of the second signal based on a drift of the electrical signal. The receiver comprising a variable gain amplifier coupled to the magnitude correction circuit. The variable gain amplifier is to generate a compensated electrical signal based on the amplification or attenuation of the second signal determined by the magnitude correction circuit. The receiver comprising a phase correction circuit coupled to the magnitude correction circuit. The phase correction circuit is to output a phase compensated modulated signal. The receiver comprising a bandpass filter coupled to the variable gain amplifier. The bandpass filter to filter an amplified first signal from the compensated electrical signal. The receiver comprising a de-modulating mixer coupled to the bandpass filter and the phase correction circuit. The de-modulating mixer to mix the phase compensated modulated signal from the phase correction circuit and the amplified first signal. Although, the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation. These and other features of the applicant's teachings are set forth herein.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which.

DETAILED DESCRIPTION

Figure 1:
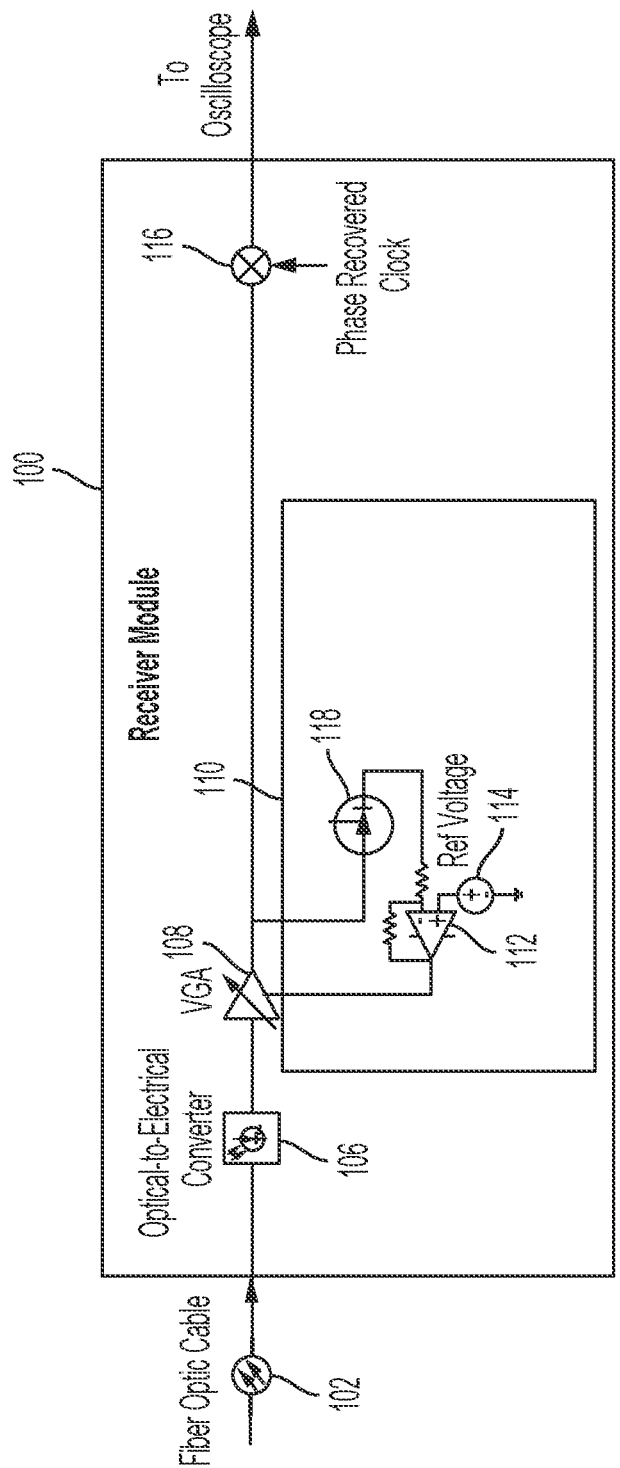
FIG. 1 is one aspect of a receiver comprising a magnitude correction circuit according to an exemplary aspect of the disclosure.

An optically isolated measurement system communicates over an optical domain and acts as an isolation barrier preventing electricity from the DUT side of the barrier from affecting the oscilloscope. A transmitter on the DUT side comprising a heterodyne modulating mixer with a local oscillator (LO) and Electrical-to-Optical (E/O) converter. The transmitter transmits the optical signal over an optical fiber to a receiver. The receiver comprises an Optical-to-Electrical (O/E) converter and heterodyne demodulating mixer with a phase recovered local oscillator. The fundamental frequency generated by the LO is recovered by a phase-locked loop and in-phase (I) and in-quadrature (Q) demodulation.

Temperature changes create significant measurement errors. First, the E/O and O/E converters' gains drift with temperature changes which causes the DUT signal to drift with temperature. The local oscillator cannot be used to recover the gain, because after mixing with the signal from the DUT, it is modulated by an unknown signal to be measured. The local oscillator frequency cannot be used to recover the phase because the polarity of the DUT signal is unknown. The DUT signal is a first signal.

A secondary tone, or pilot tone, can be created to recover the phase. The secondary tone is a second signal. The polarity of the secondary tone can be determined through factory calibration. The phase of the DUT signal also drifts with temperature. If the pilot tone and local oscillator are at different frequencies, the phase of the pilot tone compared to the local oscillator will drift with respect to each other, resulting in an unoptimized IQ vector for that given temperature, which results in measurement gain and distortion errors.

A pilot tone which is out of the bandwidth of the heterodyne mixed band of the instrument can be used to recover the gain and relative phase as the pilot tone's magnitude and phase drifts with the DUT signal due to temperature. The pilot tone is in the passband of the E/O and O/E devices and separated enough from the modulated DUT signal band such that the pilot tone can be filtered out of an acquisition measurement and tapped off combined signal lines to later recover the gain and phase information. This signal is to be summed into the same conductor before E/O conversion such that it shares the same gain change as the DUT signal, and therefore can be used to recover correct gain.

In the receiver after the O/E conversion, both the pilot tone and the modulated DUT signal are passed through a magnitude correction circuit. The pilot tone is then tapped off and sent to a gain/attenuation and phase recovery circuit. The DUT (first) signal is sent to a mixer to be demodulated.

In one aspect, gain/attenuation recovery is achieved with a feedback loop designed fully in hardware. The pilot tone tap can include the necessary bandpass filtering and amplification or attenuation stages to achieve cleanliness and voltage levels. The secondary tone is then passed through a limiting amplifier with a received signal strength indicator (RSSI) output. This stage gains up the pilot tone to the point of saturation, creating a square wave which will then be sent to the IQ demodulator for phase recovery. The RSSI is an analog output proportional to the amplitude of the received pilot tone. This signal is then fed back through an inverting integrator to control the gain or attenuation of the magnitude correction circuit. The DUT signal band gain is modulated by the same amount as the pilot tone, thus correcting both signals for the temperature effects through the optical converter link. Any difference in temperature dependence between the DUT signal band and the frequency of the pilot tone will result in a residual error after correction. Characterizing the system and selecting the appropriate frequency bands influences the accuracy of this system.

Other elements that influence the accuracy of this system are the amplitude and signal fidelity of the pilot tone. It is desirable to have the pilot tone be as small as possible in the optical converter link to minimize intermodulation distortion between the pilot tone and DUT signal. In one aspect, the pilot tone can be selected to be large enough such that after tapping it off after the magnitude correction circuit the signal is large enough that noise on the line or noise contributions from the limiting amplifier do not affect the feedback loop or introduce low frequency noise on the DUT signal. The integrator and other filtering limits the band to minimize the impact of this noise. The signal is linear over the entire range of necessary amplitudes to account for the full range of variation of the gain of the optical converters. Distortion of this signal would create error in gain correction.

To recover the phase for the demodulation, the saturated output of the limiting amplifier of the pilot tone is sent to an IQ demodulator. The IQ vector is swept and optimized during factory calibration for peak gain, correct phase (either inverting or non-inverting can be chosen) and distortion. The relative phase of the pilot tone and the modulation frequency tone drifts with temperature, and therefore for optimal performance the IQ vector also should change with temperature.

At each temperature, a compromise is made between optimizing distortion and maximizing gain. From the fundamental frequency generated by a hardware implemented local oscillator, a new fundamental is generated by hardware multiplying the I (in-phase) and Q (in-quadrature) components by signed constants produced by two programmable digital-to-analog converters (DACs). The I multiplier and Q multiplier, together, form an IQ vector whose length and direction/phase can be programmed. The gain and distortion can be changed both by changing the phase of the IQ vector and/or its length; whereas the effect of changing the length of the IQ vector is generally minor, the phase effect is drastic—the amplitude can go from a local maximum to zero just by changing the angle by 45 degrees, and the harmonic distortion also changes very quickly with this phase.

Generally, what maximizes amplitude also minimizes distortion, but sometimes what is best for amplitude is not best for distortion, and vice-versa. The "distance" between the extrema is sometimes up to 10 degrees. When optimizing phase (and length), the two objectives are given weights so that there is not too much amplitude (which will hinder the signal to noise (SNR) performance) lost nor is there too much distortion (which will hinder the total harmonic distortion (THD) performance). In practice, achieving the optimal compromise is done by giving a weight to each summand in the optimization function. In addition, the ideal IQ phase changes with temperature In one aspect, the method was to measure the best phase $\phi_{RM}$ (minimizing distortion and maximizing amplitude, each with a weight in the optimizing function) at room temperature. The exact temperature $T_{RM}$ present at this time is stored. The probe is then put in a miniature refrigerator. The same optimization is performed there, giving $\phi_{FR}$ at $T_{FR}$. Finally, while in operation, the IQ vector is rotated by an angle $(\phi_{FR}-\phi_{RM}) (T-T_{RM})/(T_{FR}-T_{RM})$. This rotation is performed via integer arithmetic calculation, performing an integer number of infinitesimal rotations of the IQ vector (approximately one such small rotation per degree Celsius). During operation, the temperature is measured on board with a thermal sensor. As temperature changes, the onboard microcontroller adjusts the IQ vector on the fly according to the equation.

Characterizing the resulting performance across the device operating temperature for many units determines if the temperature coefficient is consistent enough that the same coefficient can be used for each unit. If the median ideal coefficient produces errors too large to achieve the desired specifications, each unit is measured during factory calibration to optimize each unit for its own drift characteristics.

Turning now to the Figures, FIG. 1 is one aspect of a receiver 100 comprising a magnitude correction circuit according to an exemplary aspect of the disclosure. The receiver 100 is coupled to a fiber optic cable 102 and an oscilloscope (not shown). The receiver 100 receives an optical signal from the fiber optic cable 102. The receiver 100 comprises an optical to electrical converter 106 to convert the optical signal into an electrical signal. The electrical signal is defined by a phase and amplitude. The electrical signal is a combined electrical signal comprising a first signal and a second signal. In one aspect, the first signal is a device under test signal and the second signal is a pilot tone/signal or secondary tone/signal. For example, the device under test signal is a signal from a device detected by a probe to be measured by the oscilloscope. The pilot tone is a secondary tone to recover a gain/attenuation and a phase of the first signal. In one aspect, the second signal is out of the pass band of the first signal.

The receiver 100 further comprises a magnitude correction circuit 110 (an automatic gain/attenuation control block or correction circuit) to receive the electrical signal and to determine a gain or attenuation of the electrical signal. The gain or attenuation of the electrical signal is based on the drift of the electrical signal caused by a change in temperature. The gain or attenuation is used to determine the amplitude of the electrical signal before it was sent through the fiber optic cable 102.

The magnitude correction circuit 110 determines an amplification or attenuation of the second signal. The magnitude correction circuit 110 comprises a detector 118 coupled to the variable gain amplifier 108. The detector 118 generates a control signal proportional to received power of the second signal. The input received power is the voltage and current of the second signal. In one aspect, the detector 118 converts the second signal from an AC signal to a DC signal. In one aspect, the detector 118 is a rectifier. An error amplifier 112 is coupled to the detector 118 to compare a reference voltage 114 against an output of the detector 118 to generate a signal proportional to the difference between the reference voltage and the output of the detector to determine an amplification or attenuation of the second signal. The amplification or attenuation of the second signal varies based on a drift of the electrical signal due to temperature. In one aspect, the detector 118 is coupled to the output of a variable gain amplifier 108. In one aspect, the error amplifier 112 is an inverting amplifier.

The receiver 100 comprises a variable gain amplifier 108 coupled to the magnitude correction circuit 110 and the fiber optic cable 102. The variable gain amplifier 108 generates a compensated electrical signal based on the amplification or attenuation of the second signal determined by the magnitude correction circuit 110. The variable gain amplifier 108 amplifies or attenuates the electrical signal by the gain or attenuation determined by the error amplifier 112. The magnitude correction circuit 110 coupled to the variable gain amplifier creates a negative feedback to adjust the variable gain or attenuation of the electrical signal and maintain a constant feedback with changing temperature. The variable gain amplifier outputs a compensated electrical signal.

The receiver 100 further comprises a de-modulating mixer 116 coupled to the magnitude correction circuit 110. The output of the variable gain amplifier 108 is coupled to the de-modulating mixer 116 to mix a phase compensated signal and the compensated electrical signal. In one aspect, the phase compensated signal is determined by a phase recovered clock. The mixer 116 outputs a signal with a corrected amplitude such that the amplitude is equal to the amplitude of the first signal before it was sent by the transmitter.

Figure 2:
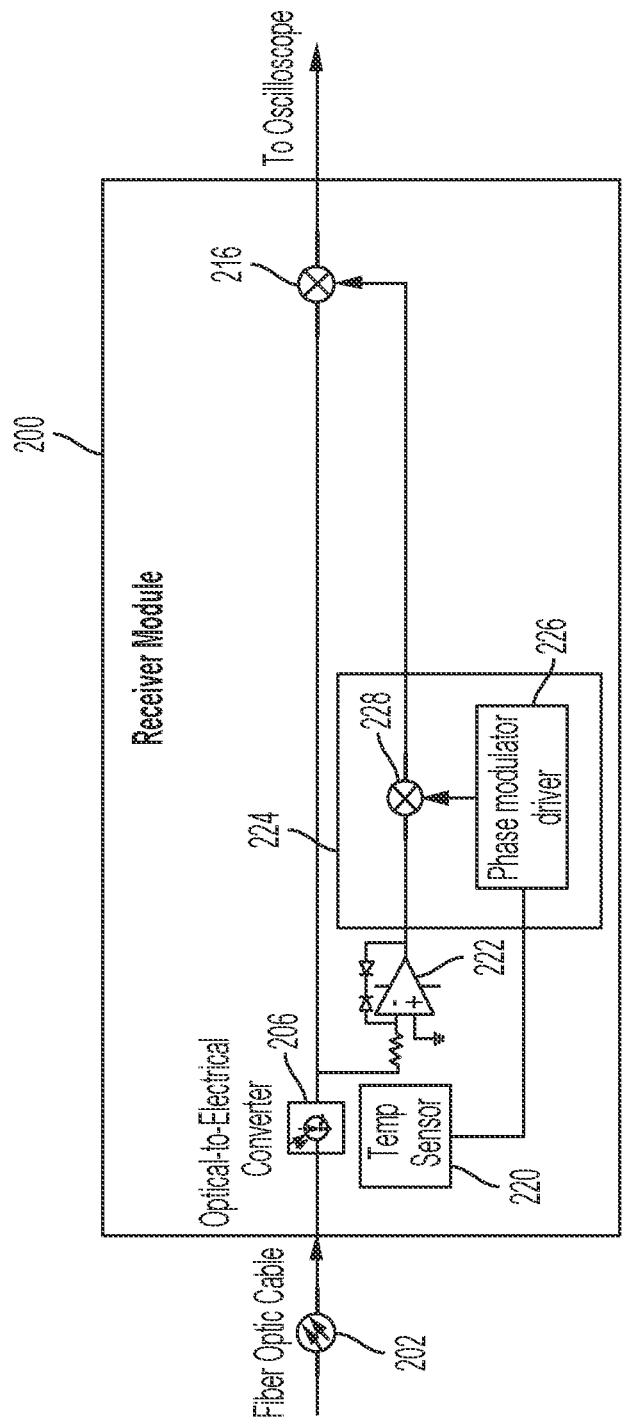
FIG. 2 is one aspect of a receiver comprising a phase correction circuit according to an exemplary aspect of the disclosure.

FIG. 2 is one aspect of a receiver 200 comprising a phase correction circuit according to an exemplary aspect of the disclosure. The receiver 200 is coupled to a fiber optic cable 202 and an oscilloscope (not shown). The receiver 200 receives an optical signal. The receiver 200 comprises an optical to electrical converter 206 and a phase correction circuit 224. The optical to electrical converter 206 converts the received optical signal into an electrical signal. The electrical signal, defined by an amplitude and a phase, is a combined signal comprising a first and second signal. The output of the optical to electrical converter 206 is coupled to the phase correction circuit 224 which receives the electrical signal. The receiver 200 further comprises a limiting amplifier 222 coupled to the optical to electrical converter 206 to normalize the gain of the second signal before the second signal is sent to the phase correction circuit.

The phase correction circuit 224, coupled to the limiting amplifier 222, comprises a modulator circuit 226. The output of the phase correction circuit 224 is coupled to a mixer 228. The modulator circuit 226 is coupled to a temperature sensor 220 and receives a temperature dependent phase compensated signal. The temperature dependent phase compensated signal is based on the temperature measured by the temperature sensor 220. The temperature sensor 220 is to output a value indicative of a phase shift of the electrical signal based on the temperature. The modulator circuit 226 is coupled to the mixer 228. The mixer 228 is also coupled to the limiting amplifier 222 to receive a reference signal defined by the phase of the electrical signal. The limiting amplifier 222 determines the reference signal defined by the phase of the electrical signal.

The phase correction circuit 224 outputs a phase compensated modulated signal. The phase compensated signal is a phase shifted second signal that compensates for the phase shift due to temperature variations. The receiver 200 comprises a mixer 216 coupled to the phase correction circuit 224. In one aspect, the mixer 216 is a de-modulating mixer. The mixer 216 mixes the phase compensated modulated signal from the phase correction circuit 224 and a compensated first signal. In one aspect, the compensated first signal is the output of the optical to electrical converter 206. In another aspect, the compensated first signal is a gain or attenuation of the first signal. The mixer 216 outputs a signal with a corrected phase such that the signal has the same phase as the signal before it was sent by a transmitter.

Figure 3:
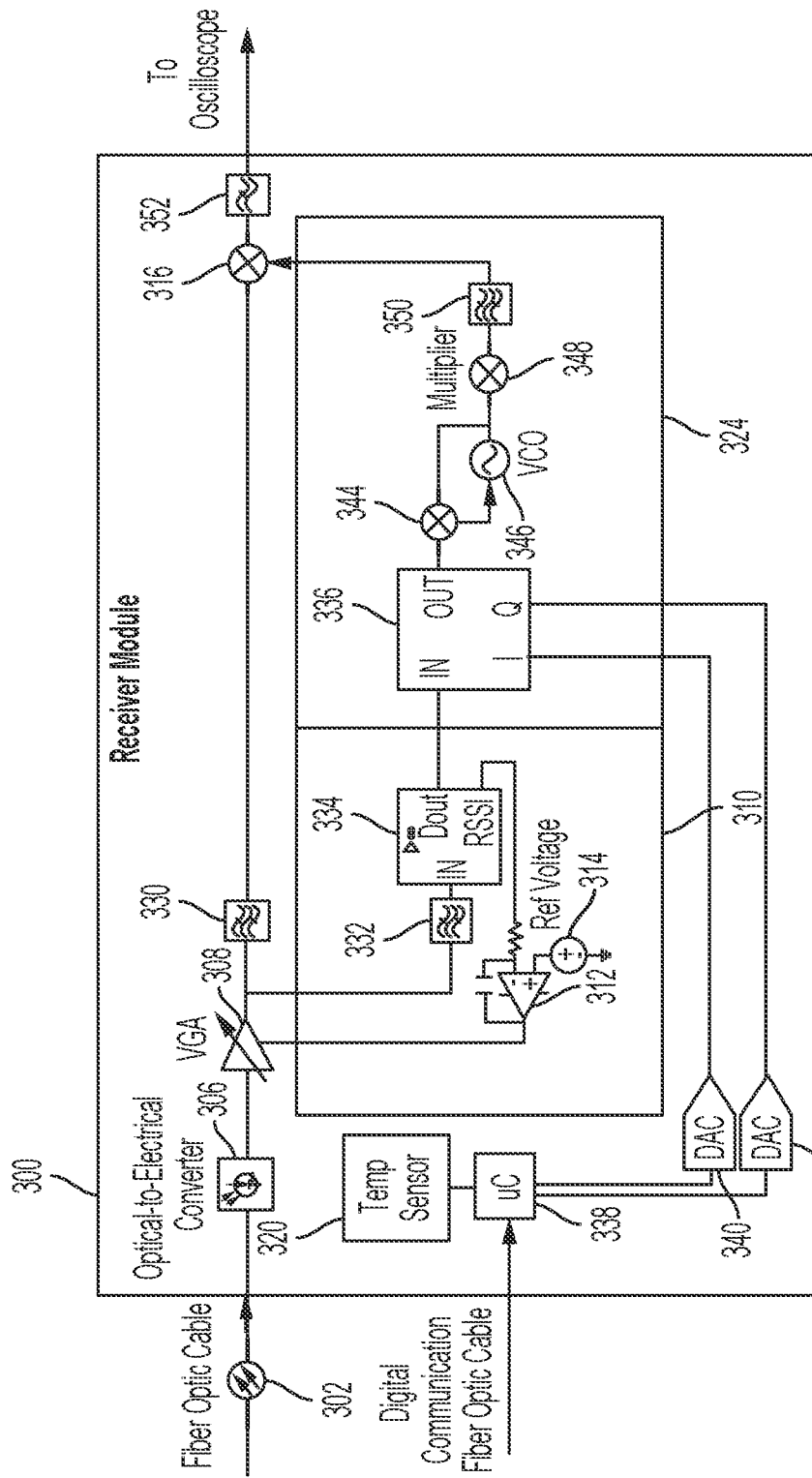
FIG. 3 is one aspect of a receiver comprising a magnitude correction circuit and a phase correction circuit according to an exemplary aspect of the disclosure.

FIG. 3 is one aspect of a receiver 300 comprising a magnitude correction circuit and a phase correction circuit according to an exemplary aspect of the disclosure. The receiver 300 is coupled to a fiber optic cable 302 and an oscilloscope (not shown). The receiver 300 comprises an optical to electrical converter 306 coupled to the fiber optical cable 302 to convert the optical signal into an electrical signal. The electrical signal is a combined electrical signal comprising a first signal and a second signal. In one aspect, the second signal is outside the passband of the first signal. The optical to electrical converter 306 is coupled to a variable gain amplifier 308. The receiver 300 further comprises a magnitude correction circuit 310 coupled to a phase correction circuit 324 and a de-modulating mixer 316 and a temperature sensor 320. In one aspect, the temperature sensor 320 is coupled to a microcontroller 338.

The variable gain amplifier 308 is coupled to the magnitude correction circuit 310. The magnitude correction circuit 310 comprises a bandpass filter 332 coupled to a limiting amplifier 334. The bandpass filter 332 filters the second signal from the electrical signal. The limiting amplifier 334 receives the second signal from the bandpass filter 332. The limiting amplifier 334 comprises a first output and a second output. The first output is coupled to the phase correction circuit 324 and provides a reference signal defined by the phase of the electrical signal. The second output is coupled to an error amplifier 312 and provides a received signal strength indicator of the second signal to the error amplifier 312. In one aspect, the error amplifier 312 is an inverting amplifier. The received signal strength indicator is an analog output proportional to the amplitude of the second signal. An example of a limiting amplifier is Texas Instruments ONET4251PA.

The error amplifier 312 also is coupled to a reference voltage 314. In one aspect, the reference voltage 314 is a digital to analog converter output programmed by the microcontroller 338. The microcontroller 338 calibrates the gain of the system at room temperature such that the reference voltage 314 has a calibrated gain at room temperature (the reference temperature). The error amplifier acts as an integrator to output a gain or attenuation of the second signal. The gain or attenuation of the second signal is the same gain or attenuation of the first signal. The error amplifier 312 comprises an output coupled to the variable gain amplifier. The gain or attenuation of the second signal can then be used to determine a compensated first signal which is indicative of the first signal before a gain or attenuation drift with temperature due to the system of an electrical to optical converter in a transmitter, the fiber optic cable 302, and the optical to electrical converter 306. The error amplifier 312 provides the value to amplify or attenuate the electrical signal to the variable gain amplifier 308. The variable gain amplifier 308 amplifies or attenuates the electrical signal by the value determined by the error amplifier 312. The output of the variable gain amplifier 308 is coupled to the bandpass filter 330 to filter out the attenuated or amplified second signal. The variable gain amplifier 308 is coupled to the de-modulating mixer 316. In one aspect, the bandpass filter 330 is coupled between the de-modulating mixer 316 and the variable gain amplifier 308. In one aspect, the magnitude correction circuit 310 is a feedback loop to adjust the gain based on the temperature drift.

The magnitude correction circuit 310 is coupled to the phase correction circuit 324. The phase correction circuit 324 receives the first output from the limiting amplifier 334. The first output is a saturated signal, the saturated signal gains up the first signal to the point of saturation. The phase correction circuit 324 comprises a modulator circuit 336. The modulator circuit 336 receives a reference signal defined by the phase of the electrical signal and a temperature dependent phase compensated signal. The reference signal is the first output of the limiting amplifier of the magnitude correction circuit 310. The temperature dependent phase compensated signal is based on the temperature measured by the temperature sensor 320.

In one aspect, the modulator circuit 336 comprises an IQ modulator. The IQ modulator comprises an in-phase input to receive an in-phase signal that is temperature dependent and an in-quadrature input to receive an in-quadrature signal that is temperature dependent. The temperature sensor 320 coupled to the modulator circuit 336 generates the temperature dependent phase compensated signal based on temperature measured by the temperature sensor 320. The temperature dependent phase compensated signal comprises the in-phase signal and the in-quadrature signal. The IQ modulator also receives the reference signal from the magnitude correction circuit 310. The IQ modulator modulates the reference signal with the temperature dependent phase compensated signal. The IQ modulator outputs a phase compensated signal. For example, the IQ modulator can be Texas Instruments TRF370315.

The temperature sensor 320 can be located on the receiver 300, or proximate to the receiver 300. In one aspect, the temperature sensor 320 is proximate to the optical to electrical converter 306 in the receiver 300. The microcontroller 338 tracks the temperature in comparison to the reference temperature. The temperature sensor 320 is coupled to a microcontroller 338. In one aspect, the microcontroller 338 continuously polls the temperature sensor 320. In one aspect, the microcontroller 338 calculates the in phase and in quadrature signals based on the temperature measured by the temperature sensor. In another aspect, the microcontroller has a look up table of temperatures and corresponding temperature measurements. The microcontroller 338 is connected to a first and second digital to analog converter 340, 342. The microcontroller 338 controls the in phase and in quadrature values that are output to the first and second DACs. In one aspect, the first digital to analog converter 340 is coupled to the in phase input of the IQ modulator and the second digital to analog converter 342 is coupled to the quadrature input of the IQ modulator. The temperature sensor 320 measures temperature and outputs a value indicative of a phase shift of the electrical signal based on the temperature. In one aspect, the in phase and in quadrature signals are temperature dependent.

In one aspect, the microcontroller 338 stores factory calibration data to adjust the gain. In another aspect, the microcontroller 338 stores factory calibration of phase temperature adjustment parameters. In one aspect, factory calibrating comprises the microcontroller 338 measuring the best phase $\phi_{RM}$ (minimizing distortion and maximizing amplitude, each with a weight in the optimizing function) at room temperature. The exact temperature $T_{RM}$ present at this time is stored. The probe is then put in a temperature chamber that creates a temperature variation from room temperature to measure the drift associated with temperature, such as a miniature refrigerator or an oven. In one aspect, the transmitter drift is measured in the temperature chamber. In another aspect, the receiver drift is measured in the temperature chamber. The transmitter drift and receiver drift are measured separately, such that when the receiver is in a temperature chamber the transmitter is at room temperature and vice versa. In one aspect, the transmitter drift is calculated when the transmitter is in the temperature chamber to form a transmitter temperature curve. The receiver drift is calculated when the receiver is in the temperature chamber to form a receiver temperature curve. The transmitter temperature curve and the receiver temperature curve may be different curves. The same optimization is performed there, giving $\phi_{FR}$ at $T_{FR}$. Finally, while in operation, the IQ vector is rotated by an angle $(\phi_{FR}-\phi_{RM})(T-T_{RM})/(T_{FR}-T_{RM})$. This rotation is performed via integer arithmetic calculation, performing an integer number of infinitesimal rotations of the IQ vector (approximately one such small rotation per degree Celsius). During operation, the temperature is measured on board with a thermal sensor (temperature sensor 320). As temperature changes, the onboard microcontroller 338 adjusts the IQ vector on the fly according to the equation.

The modulator circuit 336 outputs a phase compensated modulated signal based on a phase drift of the electrical signal. The modulator circuit 336 is coupled to a phase-locked loop circuit. The phase-locked loop comprises a multiplier 344 to receive the phase compensated modulated signal from the modulator circuit 336. The phase lock loop circuit comprises a voltage controlled oscillator 346 and a multiplier 348 coupled to the voltage controlled oscillator 346. In one aspect, the multiplier 348 is a frequency multiplier. The multiplier 344 creates two outputs of the phase compensated modulated signal. The first output of the phase compensated electrical signal is sent to a voltage controlled oscillator (VCO) 346. The second is sent to a multiplier 348. The multiplier multiples the output of the VCO 346 and the phase modulated electrical signal. A bandpass filter 350 is coupled to the multiplier 348 in order to output the phase compensated modulated signal. The phase-locked loop circuit synchronizes the output of the phase compensated modulated signal and normalizes the amplitude of the phase compensated modulated signal.

The output of the variable gain amplifier 308 is coupled to a bandpass filter 330 and outputs a compensated first signal. The phase correction circuit 324 outputs a phase compensated modulated signal. The mixer 316 mixes the compensated first signal with a phase compensated modulated signal. In one aspect, the mixer 316 is a heterodyne de-modulating mixer. The mixer 316 then outputs the signal to be measured by the oscilloscope with a phase and gain/attenuation compensation. The signal recovers the phase and amplitude of the electrical signal sent by a transmitter. The mixer 316 is coupled to a filter 352 to filter the signal to be measured by the oscilloscope.

In one aspect, the receiver 300 is coupled to a digital communication fiber optic cable. The digital communication fiber optic cable is coupled to the microcontroller 338 of the receiver 300 to receive temperature measurements of the transmitter. The microcontroller 338 adjusts the IQ signals based on a potential different transmitter temperature environment.

Figure 4:
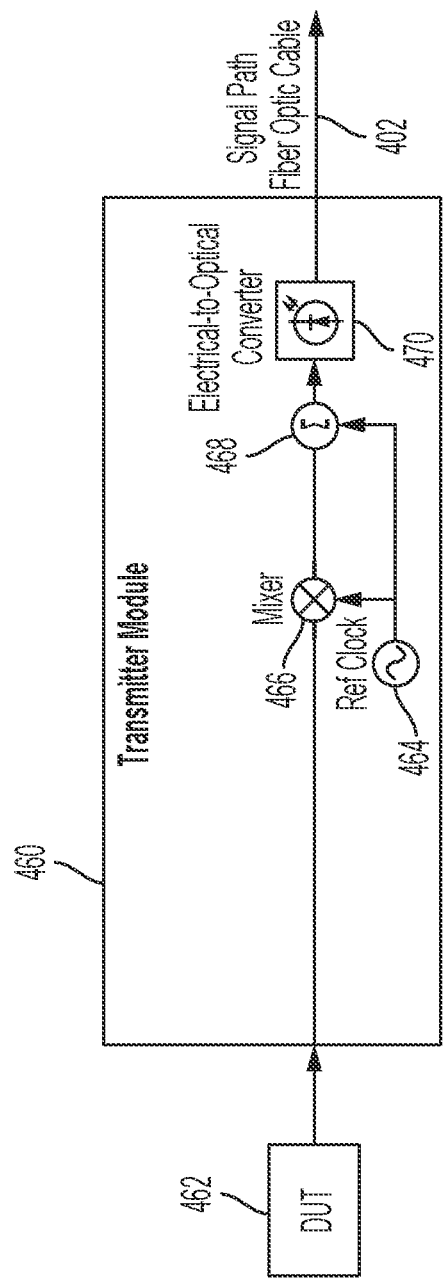
FIG. 4 is one aspect of a transmitter according to an exemplary aspect of the disclosure.

FIG. 4 is one aspect of a transmitter 460 according to an exemplary aspect of the disclosure. The transmitter 460 is coupled to a device under test 462. For example, the device under test 462 is a device with a voltage and frequency to be detected by a probe and sent to an oscilloscope to be measured. The transmitter 460 receives a device under test signal indicative of the voltage and frequency of the device. The device under test signal is also referred to as the first signal. The transmitter 460 comprises a reference clock 464. The reference clock 464 outputs a second signal. The transmitter 460 comprises a mixer 466 coupled to the device under test 462 and the reference clock 464 to receive the first signal and second signal. The mixer 466 modulates the first signal with the second signal to output a modulated first signal. The transmitter 460 further comprises a summation circuit 468 (also referred to as a summing node) that combines the modulated first signal and the second signal into a combined electrical signal. The summation circuit 468 is coupled to an electrical to optical converter 470. The combined electrical signal is sent to the electrical to optical converter 420 to convert the combined electrical signal into an optical signal. The optical signal is then sent down the fiber optic cable 402 to a receiver (shown in FIG. 3). The receiver de-modulates the signal for the oscilloscope to measure.

Figure 5:
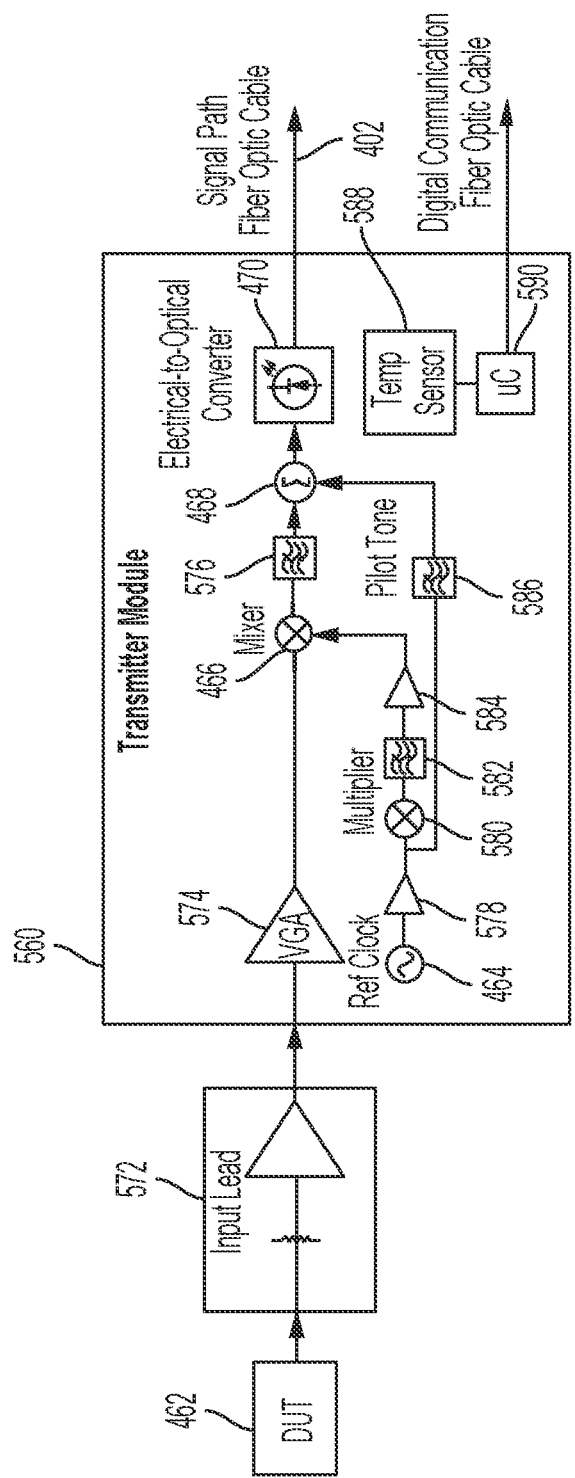
FIG. 5 is one aspect of a transmitter according to an exemplary aspect of the disclosure.

FIG. 5 is one aspect of a transmitter 560 according to an exemplary aspect of the disclosure. The transmitter 560 in FIG. 5 comprises all elements of FIG. 4. The transmitter 560 is coupled to an input lead 572 that measures the device under test 462. For example, the input lead 572 facilitates making a physical connection with the device under test 462 to measure the device under test 462. The transmitter 560 comprises a variable gain amplifier 574 coupled to the input lead. The variable gain amplifier 574 is coupled to the mixer 466. The variable gain amplifier 574 amplifies or attenuates the first signal to send to the mixer 466. The output of the mixer 466 is coupled to a bandpass filter 576.

The transmitter 560 further comprises the reference clock 464 coupled to an amplifier 578. The amplifier 578 is coupled to a multiplier and a bandpass filter 586. The multiplier 580 coupled to a bandpass filter 582 which is coupled to an amplifier 584. In one aspect, the multiplier 580 is a frequency multiplier. The reference clock is multiplied to create a phase-deterministic local oscillator. In one aspect, the multiplier 580 creates clock for modulation which is a distinct different band from the second signal. The bandpass filter 582 filters the reference clock signal. The amplifier 584 is coupled to the mixer 466 and amplifies the reference clock signal sent to the mixer 466. In one aspect, the mixer 466 is a heterodyne modulation mixer. The mixer 466 mixes the first signal (device under test signal) with the output of the amplifier 584, which is the phase deterministic local oscillator. The mixer 466 is coupled to a bandpass filter 576 to filter the modulated first signal. In one aspect, the bandpass filter 576 filters out anything other than the modulated input signal. The modulated input signal is the modulated device under test signal. The bandpass filter 576 is coupled to the summation circuit 468.

The bandpass filter 586 is coupled to the summation circuit 468 and filters the reference clock signal sent to the summation circuit 468. The summation circuit 468 combines the first signal and the second signal. The first signal is the signal from the mixer 466 and the second signal is the reference clock signal from bandpass filter 586. The summation circuit 468 is coupled to the electrical to optical converter 470 where the electrical signal is converted to an optical signal to transmit the optical signal through the fiber optic cable 402 to a receiver (shown in FIGS. 1, 2, and 3). The signal output from the summation circuit 468 is a combined signal because it comprises the first signal and the second signal.

The transmitter 560 further comprises a temperature sensor 588 coupled to a microcontroller 590. The temperature sensor 588 can be located on the transmitter 560, or proximate to the transmitter 560. In one aspect, the temperature sensor 588 is proximate to the electrical to optical converter 470. The temperature sensor 588 measures the temperature of the transmitter 560 in order to communicate through the optical fiber to a microcontroller in a receiver, such that the receiver could adjust the IQ correction based on a potential different transmitter temperature environment. The temperature signal is sent through a digital communication fiber optic cable. In one aspect, the microcontroller 590 tracks the temperature in comparison to the reference temperature.

In one aspect, the electrical to optical converters of transmitters of FIGS. 4 and 5 and the optical to electrical converters of FIGS. 1-3 both drift with temperature. For conciseness and clarity, when referring to FIG. 3, all elements can be executed with either of the receivers from FIG. 1 or 2 as well. In addition, when referring to FIG. 5, all elements can be executed with the receiver FIG. 4. In one aspect, when the transmitter 560 and receiver 300 are separated by a long fiber optical cable 302, the transmitter 560 and receiver 300 may be at different temperatures. In one aspect, the phase correction is calculated based on the combination of both the transmitter and receiver temperatures. In one aspect, the phase correction uses the transmitter temperature curve and the receiver temperature curve. For example, the microcontroller 590 of the transmitter 560 communicates with the microcontroller 338 of the receiver 300 over the digital communication fiber optic cable. The microcontroller 338 calculates the weighted inputs for the temperatures from the temperature sensors of the transmitter 560 and receiver 300. The magnitude correction inherently accounts for both drifts without this communication.

Figure 6:
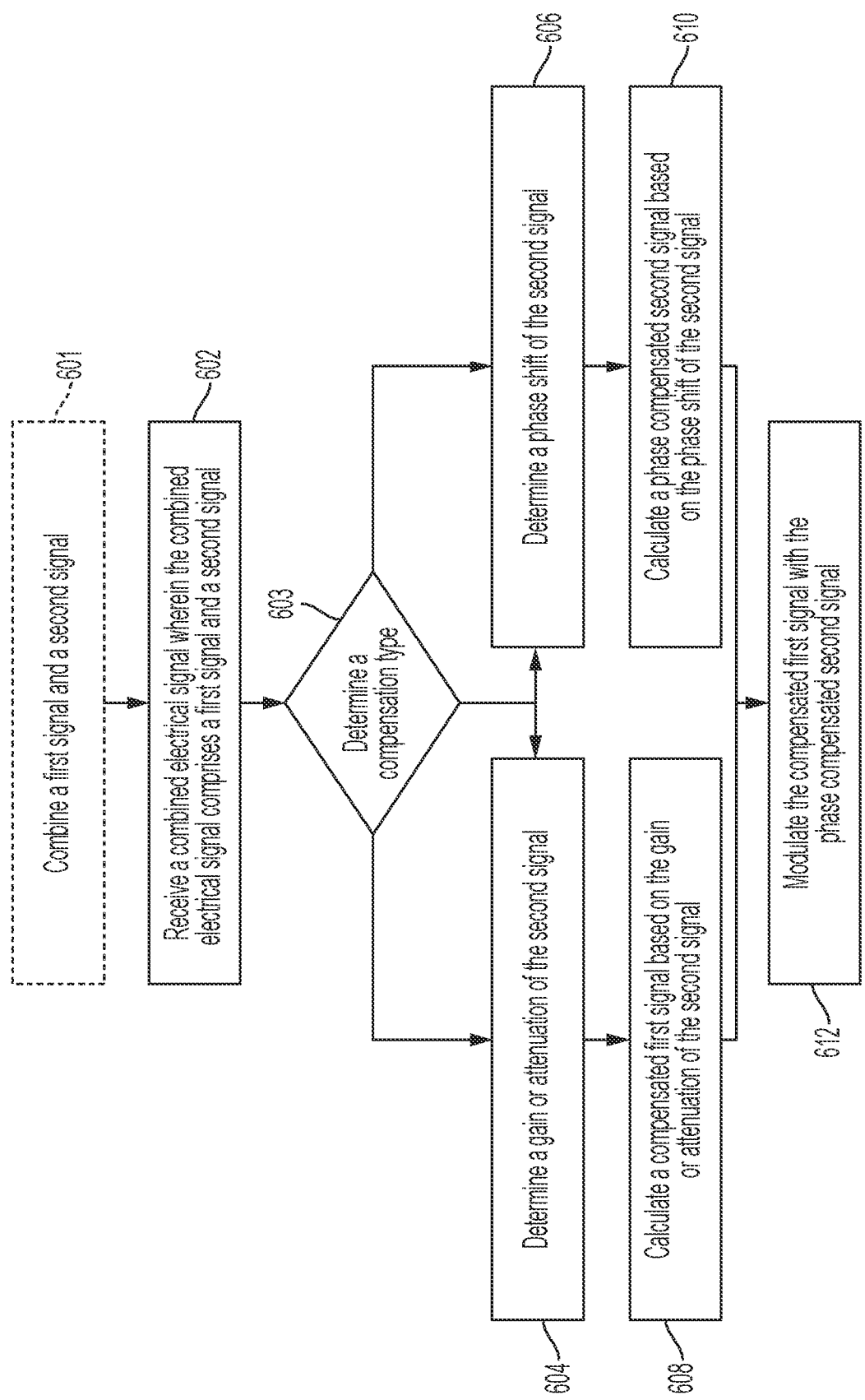
FIG. 6 is a logic flow diagram of a method of operating a receiver and transmitter according to an exemplary aspect of the disclosure.

The transmitters of FIG. 4 or 5 can be connected to the receivers of FIG. 1, 2, or 3. In one aspect, the reference clocks in the transmitter and receiver are of the same frequency. In one aspect, when the reference clock modulation signal in the transmitter is multiplied to create a phase deterministic local oscillator, the phase recovered clock is in receiver is multiplied by the same multiplier to create a de-modulated clock. For example, the system comprises a transmitter from any of FIGS. 4-5 and a receiver from any of FIGS. 1-3. For conciseness and clarity, when referring to FIG. 3, all elements can be executed with either of the receivers from FIG. 1 or 2 as well. In addition, when referring to FIG. 5, all elements can be executed with the receiver FIG. 4. The transmitter 560 comprises a reference clock 464 with a reference clock signal, a mixer 466 coupled to the reference clock 464 to mix the reference clock signal with an input to the transmitter 560 to output a first signal, a summation circuit 468 coupled to the reference clock 464 and the mixer 466 to combine the first signal and the reference clock signal to form a combined electrical signal, and an electrical to optical converter 470 to convert the combined electrical signal into an optical signal. The receiver 300 comprising a temperature sensor 320, an optical to electrical converter 306 to receive an optical signal and convert the optical signal to an electrical signal defined by a phase. The electrical signal is a combined electrical signal comprising the first signal and a second signal. The receiver 300 comprising a magnitude correction circuit 310 coupled to the optical to electrical converter 306. The magnitude correction circuit 310 is to determine an amplification or attenuation of the second signal based on a drift of the electrical signal. The receiver 300 comprising a variable gain amplifier 308 coupled to the magnitude correction circuit 310. The variable gain amplifier 308 is to generate a compensated electrical signal based on the amplification or attenuation of the second signal determined by the magnitude correction circuit 310. The receiver 300 comprising a phase correction circuit 324 coupled to the magnitude correction circuit 310. The phase correction circuit 324 is to output a phase compensated modulated signal. The receiver 300 comprising a bandpass filter 330 coupled to the variable gain amplifier 308. The bandpass filter 330 to filter an amplified first signal from the compensated electrical signal. The receiver 300 comprising a de-modulating mixer 316 coupled to the bandpass filter 330 and the phase correction circuit 324. The de-modulating mixer 316 to mix the phase compensated modulated signal from the phase correction circuit 310 and the amplified first signal. FIG. 6 is a logic flow diagram of a method 600 of operating a receiver and transmitter according to an exemplary aspect of the disclosure. With reference now to FIG. 6 together with FIGS. 1-5, according to the method 600, the receiver 100, 200, 300 receives 602 a combined electrical signal. For conciseness and clarity, the method 600 when referring to FIG. 3 can be executed with either of the receivers from FIG. 1 or 2 as well. In addition, the method 600 can be executed with either transmitter from FIG. 4 or 5. For conciseness and clarity FIG. 5 will be used in reference to implementing the method 600. The combined electrical signal comprises a first and second signal. The receiver 300 determines 603 a compensation type, wherein the compensation type comprises a gain or attenuation compensation. The magnitude correction circuit 310 determines 604 a gain or attenuation of the second signal. The variable gain amplifier calculates 608 a compensated first signal based on the gain or attenuation of the second signal. The mixer modulates 612 the compensated first signal with the phase compensated second signal.

In one aspect, the method 600 further comprises combining 601 the first signal and the second signal.

In one aspect, the compensation type further comprises phase compensation. The phase correction circuit 324 determines 606 a phase shift of the second signal. The modulator circuit 336 calculates 610 a phase compensated second signal based on the phase shift of the second signal.

In one aspect, the method 600 further comprises receiving a temperature from a temperature sensor 320. In one aspect, the microcontroller 338 determines a temperature dependent signal indicative of the phase shift of the second signal based on the temperature.

In one aspect, the method 600 further comprises filtering, by the bandpass filter 330, a compensated first signal from the compensated signal.

In one aspect, the method 600 further comprises receiving, by the receiver 300, an optical signal. The optical to electrical converter 306 converts an optical signal into the electrical signal.

In one aspect, the method 600 further comprises filtering, by the bandpass filter 332, the second signal from the electrical signal. The limiting amplifier 334 calculates a reference signal defined by the phase of the electrical signal and a received signal strength of the second signal.

In one aspect, the method 600 comprises receiving, by the receiver 300, a combined electrical signal wherein the combined electrical signal comprises a first signal and a second signal. The receiver 300 determines a compensation type, wherein the compensation type comprises a phase compensation. The phase correction circuit 324 determines a phase shift of the second signal. The modulator circuit 336 calculates a phase compensated second signal based on the phase shift of the second signal. The mixer 316 modulates a compensated first signal with the phase compensated second signal.

In one aspect, the method 600 further comprises combining 601 the first signal and the second signal.

In one aspect, the method 600 further comprises receiving a temperature from a temperature sensor 320. In one aspect, the method 600 further comprises determining a temperature dependent signal, by the microcontroller 338, indicative of the phase shift of the second signal based on the temperature.

In one aspect, the method 600 further comprises receiving, by the receiver 300, an optical signal. The optical to electrical converter 306 converts an optical signal into the electrical signal.

In one aspect, the method 600 further comprises determining, by the microcontroller 338, an in-phase value and in-quadrature value based on the temperature measured by the temperature sensor 320. In one aspect, the modulator circuit 336 receives an in-quadrature signal based on the temperature, an in-phase signal based on temperature, and a reference signal defined by the phase of the electrical signal.

In one aspect, the method 600 comprises operating a transmitter 560 and receiver 300 of an optically isolated probe. The transmitter 560 sends an optical signal containing a combined electrical signal. The receiver 300 receives the combined electrical signal wherein the electrical signal comprises a first signal and a second signal. The receiver 300 determines a compensation type. The compensation type comprises at least one of a gain or attenuation compensation or a phase compensation. The magnitude correction circuit 310 determines a gain or attenuation of the second signal. The phase correction circuit 324 determines a phase shift of the second signal. The variable gain amplifier 308 calculates a compensated first signal based on the gain or attenuation of the second signal. The modulator circuit 336 calculates a phase compensated second signal based on the phase shift of the second signal. The mixer 316 modulating the compensated first signal with the phase compensated second signal.

In one aspect, the method 600 further comprises combining 601 the first signal and the second signal. In one aspect, the method 600 further comprises summing by the summation circuit 468 the first signal and the second signal into the electrical signal.

In one aspect, the method 600 further comprises the electrical to optical converter 470 converting the electrical signal to the optical signal.

In one aspect, the method 600 further comprises the optical to electrical converter 306 converting the optical signal to an electrical signal.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

In most embodiments, a processor may be a physical or virtual processor. In other embodiments, a virtual processor may be spread across one or more portions of one or more physical processors. In certain embodiments, one or more of the embodiments described herein may be embodied in hardware such as a Digital Signal Processor (DSP). In certain embodiments, one or more of the embodiments herein may be executed on a DSP. One or more of the embodiments herein may be programmed into a DSP. In some embodiments, a DSP may have one or more processors and one or more memories. In certain embodiments, a DSP may have one or more computer readable storages. In many embodiments, a DSP may be a custom designed ASIC chip. In other embodiments, one or more of the embodiments stored on a computer readable medium may be loaded into a processor and executed.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within +20% of a target value in some embodiments, within +10% of a target value in some embodiments, within +5% of a target value in some embodiments, and yet within +2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

The use of headings and sections in the application is not meant to limit the disclosure; each section can apply to any aspect, embodiment, or feature of the disclosure. Only those claims which use the words "means for" are intended to be interpreted under 35 USC 112 (f). Absent a recital of "means for" in the claims, such claims should not be construed under 35 USC 112. Limitations from the specification are not intended to be read into any claims, unless such limitations are expressly included in the claims.

Embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, embodiments may take the form of a computer program product embodied in one or more computer readable medium(s) having computer readable program code embodied thereon.

What is claimed is:

1. A receiver comprising:
   a magnitude correction circuit to receive an electrical signal defined by a phase, wherein the electrical signal is a combined electrical signal comprising a first signal and a second signal, the magnitude correction circuit comprising:
- a detector to generate a control signal proportional to received power of the second signal; and
- an error amplifier coupled to the detector to compare a reference voltage against an output of the detector to generate a signal proportional to the difference between the reference voltage and the output of the detector to determine an amplification or attenuation of the second signal based on a drift of the electrical signal;
- a variable gain amplifier coupled to the magnitude correction circuit, the variable gain amplifier to generate a compensated electrical signal based on the amplification or attenuation of the second signal determined by the magnitude correction circuit; and
- a de-modulating mixer coupled to the magnitude correction circuit, the de-modulating mixer to mix a phase compensated signal and the compensated electrical signal.

2. The receiver of claim 1, further comprising a phase correction circuit coupled to the magnitude correction circuit, the phase correction circuit comprising a modulator circuit to receive:
- a reference signal defined by the phase of the electrical signal; and
- a temperature dependent phase compensated signal;
- wherein the modulator circuit is to output a phase compensated modulated signal based on a phase drift of the electrical signal.

3. The receiver of claim 2, further comprising a temperature sensor coupled to the modulator circuit to generate the temperature dependent phase compensated signal based on temperature measured by the temperature sensor.

4. The receiver of claim 1, further comprising an optical to electrical converter coupled to the magnitude correction circuit to receive an optical signal and convert the optical signal to the electrical signal.

5. The receiver of claim 1, further comprising a bandpass filter coupled to the variable gain amplifier, the bandpass filter to filter the second signal from the compensated electrical signal.

6. The receiver of claim 1, wherein the magnitude correction circuit comprising:
- a bandpass filter to filter the second signal from the electrical signal;
- a limiting amplifier coupled to the bandpass filter to receive the second signal from the bandpass filter, the limiting amplifier comprising:
  - a first output to provide the reference signal defined by the phase of the electrical signal; and
  - a second output to provide received signal strength of the second signal; and
- the error amplifier coupled to the second output of the limiting amplifier to receive the received signal strength of the second signal, the error amplifier comprising an output coupled to the variable gain amplifier.

7. The receiver of claim 3, wherein the modulator circuit comprises an IQ modulator.

8. The receiver of claim 7, wherein the IQ modulator comprises:
- an in-phase input to receive an in-phase signal that is temperature dependent;
- an in-quadrature input to receive an in-quadrature signal that is temperature dependent; and
- a reference input to receive the reference signal defined by the phase of the electrical signal.

9. The receiver of claim 8, wherein the temperature sensor is coupled to the modulator circuit and the temperature sensor is to measure temperature and output a value indicative of a phase shift of the electrical signal based on the temperature to the modulator circuit.

10. The receiver of claim 9, further comprising a processor and memory coupled to the temperature sensor and the modulator circuit, wherein the memory stores instructions executable by the processor for a computation to determine an in-phase value and in-quadrature value based on the temperature measured by the temperature sensor and to output the in-phase and in-quadrature values to the modulator circuit.

11. The receiver of claim 10, further comprising a first digital to analog converter coupled to the in-phase input and the processor and a second digital to analog converter coupled to the in-quadrature input and the processor.

12. The receiver of claim 4, wherein the second signal is outside of bandwidth of the first signal and within a passband of the optical to electrical converter.

13. A receiver comprising:
- a phase correction circuit to receive an electrical signal defined by a phase, wherein the electrical signal is a combined electrical signal comprising a first signal and a second signal comprising a modulator circuit to receive:
  - a reference signal defined by the phase of the electrical signal; and
  - a temperature dependent phase compensated signal; and
- wherein the modulator circuit is to output a phase compensated modulated signal; and
- a de-modulating mixer coupled to the phase correction circuit, the de-modulating mixer to mix the phase compensated modulated signal from the phase correction circuit and a compensated first signal.

14. The receiver of claim 13, further comprising a temperature sensor coupled to the modulator circuit to generate the temperature dependent phase compensated signal based on temperature measured by the temperature sensor.

15. The receiver of claim 13, further comprising an optical to electrical converter coupled to the phase correction circuit to receive an optical signal and convert the optical signal to the electrical signal.

16. The receiver of claim 13, the phase correction circuit further comprising:
- a phase lock loop circuit coupled to the modulator circuit to receive the phase compensated modulated signal comprising:
  - a voltage controlled oscillator;
  - a multiplier coupled to the voltage controlled oscillator; and
  - bandpass filter coupled to the multiplier to output the phase compensated modulated signal.

17. The receiver of claim 13, wherein the compensated first signal is based on amplification or attenuation of the second signal.

18. The receiver of claim 13, wherein the modulator circuit comprises an IQ modulator and the IQ modulator comprises:
- an in-phase input to receive an in-phase signal that is temperature dependent;
- an in-quadrature input to receive an in-quadrature signal that is temperature dependent; and a reference input to receive the reference signal defined by the phase of the electrical signal.

19. The receiver of claim 14, further comprising a processor and memory coupled to the temperature sensor and the modulator circuit, wherein the memory stores instructions executable by the processor for a computation to determine an in-phase value and in-quadrature value based on the temperature measured by the temperature sensor and to output the in-phase and in-quadrature values to the modulator circuit.

20. A system comprising:
a transmitter comprising:
   a reference clock with a reference clock signal;
   a mixer coupled to the reference clock to mix the reference clock signal with an input to the transmitter to output a first signal;
   a summation circuit coupled to the reference clock and the mixer to combine the first signal and the reference clock signal to form a combined electrical signal; and
   an electrical to optical converter to convert the combined electrical signal into an optical signal; and
a receiver comprising:
   a temperature sensor;
   an optical to electrical converter to receive an optical signal and convert the optical signal to an electrical signal defined by a phase, wherein the electrical signal is a combined electrical signal comprising the first signal and a second signal;
   a magnitude correction circuit coupled to the optical to electrical converter, the magnitude correction circuit to determine an amplification or attenuation of the second signal based on a drift of the electrical signal;
   a variable gain amplifier coupled to the magnitude correction circuit, the variable gain amplifier to generate a compensated electrical signal based on the amplification or attenuation of the second signal determined by the magnitude correction circuit;
   a phase correction circuit coupled to the magnitude correction circuit, the phase correction circuit to output a phase compensated modulated signal;
   a bandpass filter coupled to the variable gain amplifier, the bandpass filter to filter an amplified first signal from the compensated electrical signal; and
   a de-modulating mixer coupled to the bandpass filter and the phase correction circuit, the de-modulating mixer to mix the phase compensated modulated signal from the phase correction circuit and the amplified first signal.

* * * * *